(12) United States Patent
Nyhus et al.

(10) Patent No.: US 7,820,550 B2
(45) Date of Patent: Oct. 26, 2010

(54) NEGATIVE TONE DOUBLE PATTERNING METHOD

(75) Inventors: Paul Nyhus, Portland, OR (US);
Charles Wallace, Portland, OR (US);
Swaminathan Sivakumar, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/205,744

(22) Filed: Sep. 5, 2008

(65) Prior Publication Data
US 2010/0062228 A1 Mar. 11, 2010

(51) Int. Cl.
*H01L 21/311* (2006.01)

(52) U.S. Cl. ............ 438/694; 438/725; 438/781; 430/312; 257/E21.236; 257/E21.259; 257/E21.492

(58) Field of Classification Search .......... 438/700, 438/908, 907, 694, 725, 780, 781; 430/312; 257/E21.235, E21.236, E21.259, E21.492
See application file for complete search history.

(56) References Cited

U.S. PATENT DOCUMENTS 5,320,932 A * 6/1994 Haraguchi et al. .......... 430/312

OTHER PUBLICATIONS

Joost Bekaert, "Contact Layer Printing at 0.28 $k_1$ by Means of Double Line Exposure and Negative Tone Development", IMEC FujiFilm, 5$^{th}$ International Symposium on Immersion Lithography Extensions, The Hague, Sep. 23, 2008 pp. 1-37.

* cited by examiner

*Primary Examiner*—Julio J Maldonado
(74) *Attorney, Agent, or Firm*—Winkle, PLLC

(57) ABSTRACT

A method of forming a pattern on a wafer is provided. The method includes applying a photoresist on the wafer and exposing the wafer to define a first pattern on the photoresist. The method also includes exposing the wafer to define a second pattern on the photoresist, wherein each of the first and second patterns comprises unexposed portions of the photoresist and developing the wafer to form the first and second patterns on the photoresist, wherein the first and second patterns are formed by removing the unexposed portions of the photoresist.

22 Claims, 5 Drawing Sheets

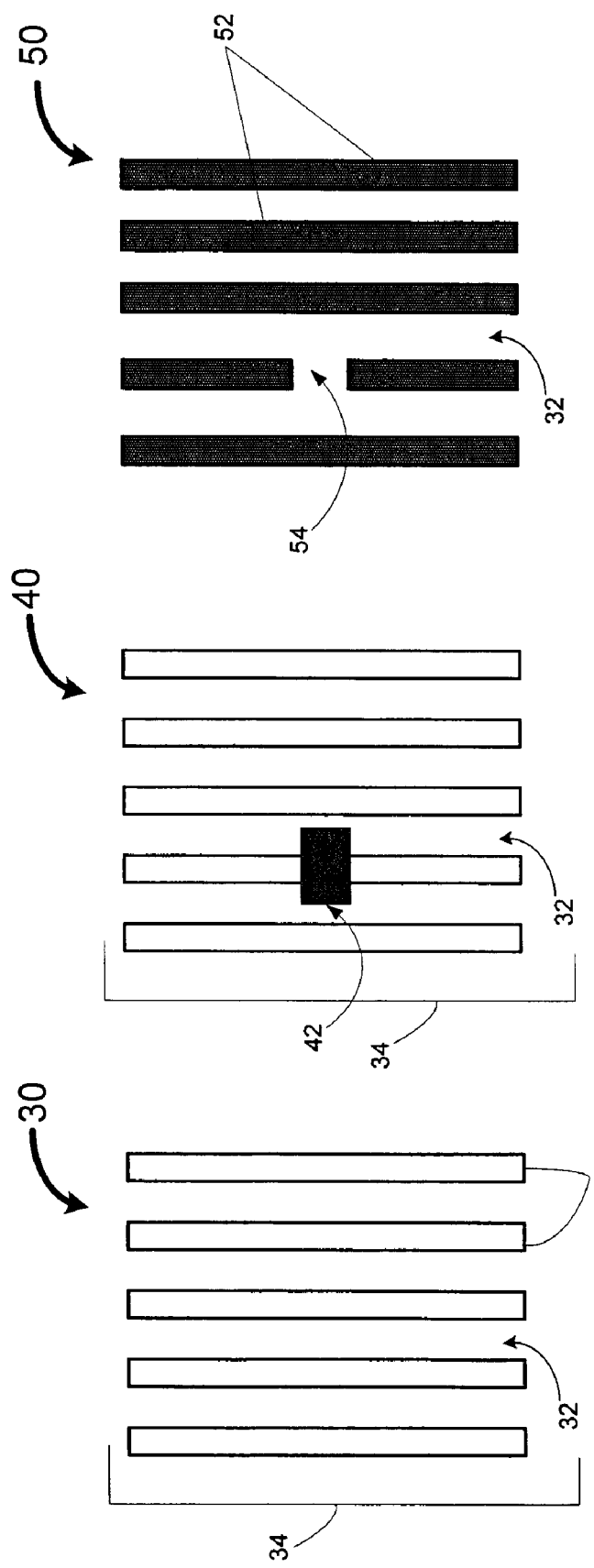

NEGATIVE TONE DOUBLE PATTERNING METHOD

BACKGROUND

Photolithography process is typically employed to manufacture electronic and opto-electronic components on a substrate of semiconductor devices. These devices may be active devices such as transistors in an integrated circuit or may be passive devices such as interconnecting conductors on a printed circuit board.

One method of forming such devices on the substrate is through double patterning on the substrate. A pattern from a first exposure may be etched onto a photoresist layer on the substrate. The substrate is subsequently recoated with the photoresist layer to image a second pattern and is re-etched to obtain the desired pattern. However, because the substrate must undergo additional etch, chemical cleans, and resist processing, there may be more defects introduced by the additional processing. Moreover, as the substrate has to make separate passes through the photoresist coat, exposure and etch for forming the pattern, this technique is substantially more expensive compared to a single exposure technique.

BRIEF DESCRIPTION OF THE DRAWINGS

Features of embodiments of the claimed subject matter will become apparent as the following detailed description proceeds, and upon reference to the drawings, in which like numerals depict like parts, and in which:

FIG. 2 illustrates an exemplary configuration of a photoresist on a wafer with a first pattern defined on the photoresist in accordance with embodiments of present technique;

FIG. 3 illustrates an exemplary configuration of photoresist on the wafer of FIG. 2 with a second pattern defined on the wafer in accordance with embodiments of present technique;

FIG. 4 illustrates an exemplary configuration of the photoresist with the first and second patterns formed on the photoresist in accordance with embodiments of present technique;

Although the following Detailed Description will proceed with reference being made to illustrative embodiments of the claimed subject matter, many alternatives, modifications, and variations thereof will be apparent to those skilled in the art. Accordingly, it is intended that the claimed subject matter be viewed broadly, and be defined only as set forth in the accompanying claims.

DETAILED DESCRIPTION

As discussed in detail below, the embodiments of the present invention function to provide a method of double patterning on a wafer. In particular, the technique uses a double exposure using a negative tone photoresist process for forming the pattern on the wafer without removing the wafer from a scanner chuck between two exposures. Advantageously, the technique described in the embodiments below does not require additional processing steps thereby reducing costs of fabrication while minimizing alignment error between the two exposures.

References in the specification to "one embodiment", "an embodiment", "an exemplary embodiment", indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Figure 1:
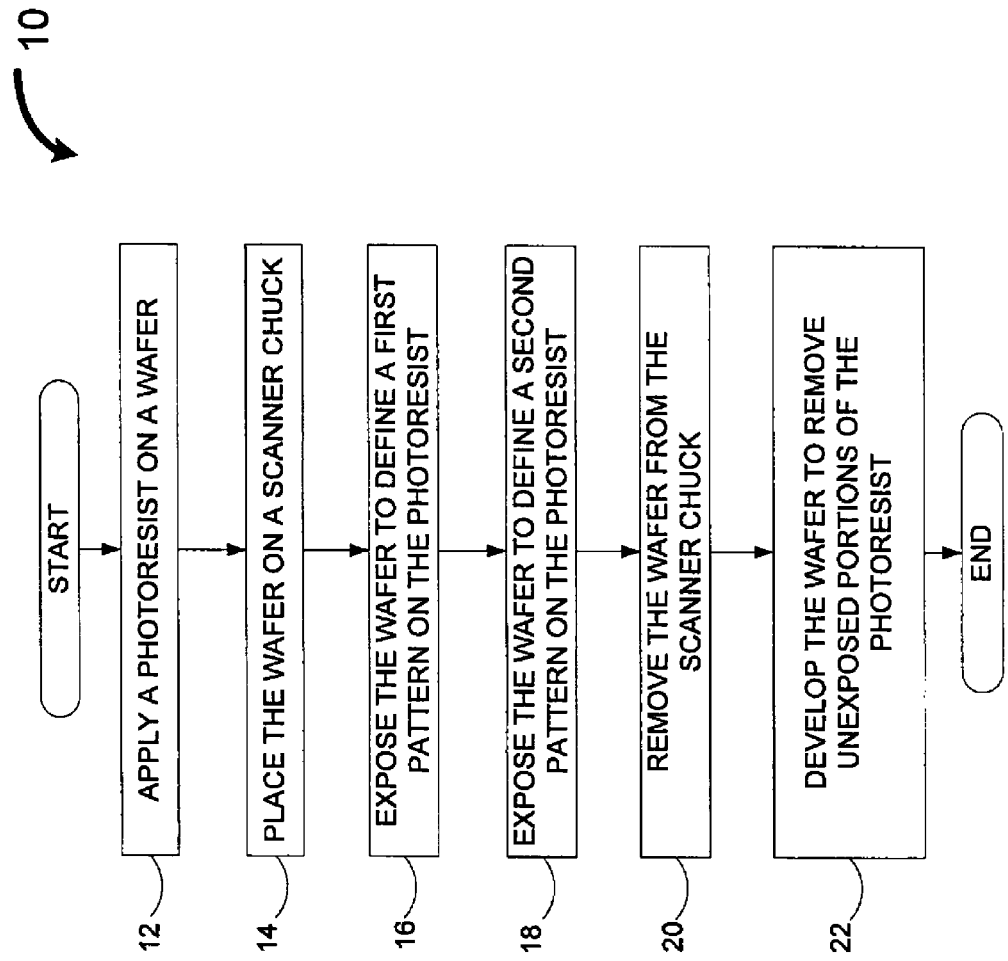
FIG. 1 illustrates an exemplary process for forming a pattern on a wafer in accordance with embodiments of present technique.

Referring first to FIG. 1, an exemplary process 10 for forming a pattern on a wafer is illustrated. At block 12, a photoresist is applied on the wafer. In an exemplary embodiment, the wafer is a part of an integrated circuit upon which a conductive layer may be formed. In one exemplary embodiment, the wafer may include active and passive devices such as transistors, capacitors, resistors, interconnects etc. Further, at block 14, the wafer coated with the photoresist is placed on a scanner chuck. The wafer coated with the photoresist is exposed to define a first pattern on the photoresist, as illustrated at block 16. In this embodiment, an image of the first pattern from a first reticle is projected onto the surface of the photoresist.

At block 18, the wafer is exposed to define a second pattern on the photoresist. It should be noted that wafer does not need to be removed from the scanner chuck between the exposures to define the first and second patterns. In this embodiment, an image of the second pattern from a second reticle is projected into the photoresist. In one exemplary embodiment, a uniform grating pattern is imaged during the first exposure to define the first pattern. However, a variety of other patterns with different orientations and varied pitches may be defined by exposing the wafer using the first reticle. In one exemplary embodiment, portions of the first pattern may be selectively exposed to form the second pattern on the uniform grating pattern. In certain embodiments, illumination sources for the first and second exposures may be configured independently to achieve a desired resolution of the images of the first and second patterns. In this exemplary embodiment, each of the first and second patterns comprises exposed and unexposed portions of the photoresist.

At block 20, the wafer is removed from the scanner chuck. Further, as represented at block 22, the wafer is developed to remove the unexposed portions of the photoresist on the wafer. In one exemplary embodiment, the unexposed portions of the photoresist are removed to form a composite pattern. In this exemplary embodiment, the composite pattern includes the first and second patterns. In this embodiment, the unexposed portions of the photoresist are removed through a negative tone resist process. As used herein, the term "negative tone resist process" refers to a resist or a process for processing the resist which results in unexposed resist being developed away and exposed resist remaining on the wafer. In one exemplary embodiment, the first and second patterns are defined using a negative tone photoresist which is developed using standard develop chemicals. Such photoresist is readily available in the market. Further, the wafer is developed to remove the unexposed portions of the photoresist.

Alternately, the first and second patterns are defined on the wafer using a positive tone photoresist. Further, the wafer is developed by a negative tone develop process to remove the unexposed portions of the photoresist. In one exemplary embodiment, a first set of features are defined by the first pattern on the photoresist. Further, portions of the first set of features may be removed to define a second set of features defined by the second pattern on the photoresist. In one exemplary embodiment, the first set of features comprises a plurality of trenches formed in the photoresist and the second set of features comprises a plurality of resist bridges. However, a plurality of other features defined by the first and second patterns and formed by the negative tone resist process described above may be envisaged. Advantageously, the negative tone resist process facilitates forming of a variety of isolated features on the resist that are difficult to achieve using existing single exposure techniques.

In one exemplary embodiment, an array of isolated features may be formed on the photoresist. In this embodiment, a first set of features are defined by the first pattern on the photoresist. Further, portions of the first set of features are plugged to form a second pattern on the photoresist. Subsequently, unexposed portions of the first and second patterns are removed using the negative tone resist process to form the array of isolated features. Once the first and second patterns are formed on the photoresist, portions of the wafer without the photoresist are selectively etched to replicate the first and second patterns from the photoresist to the wafer.

FIG. 2 illustrates an exemplary configuration 30 of a photoresist on a wafer 32 with a first pattern 34 defined on the photoresist 30. In this exemplary embodiment, the first pattern 34 is defined by projecting an image of the first pattern 34 using a first reticle (not shown). In this exemplary embodiment, areas such as represented by reference numerals 36 represent unexposed regions of the photoresist 30. In one exemplary embodiment, the first pattern 34 includes a uniform grating pattern with a pre-defined grating pitch. In one exemplary embodiment, a pitch of the uniform grating pattern formed using 193 nm wavelength light is about 80 nm. In this exemplary embodiment, an illumination source may be configured to achieve a desired pitch of the uniform grating pattern. In one exemplary embodiment, the uniform grating pattern defined by the first pattern would form a plurality of trenches on the photoresist by removing unexposed portions of the photoresist if the photoresist were to be developed at this point.

FIG. 3 illustrates an exemplary configuration 40 of photoresist on the wafer 32 of FIG. 2 with a second pattern 42 defined on the wafer 32. In this exemplary embodiment, the second pattern 42 is defined by projecting an image of the second pattern 42 using a second reticle (not shown). In this exemplary embodiment, the area 42 represents the region of the photoresist that is exposed during the second exposure. Further, the wafer 32 is developed by a negative tone resist process to remove the unexposed portions of the photoresist to form the first and second patterns 34 and 42. In one exemplary embodiment, the second pattern 42 is formed by selectively exposing unexposed photoresist of the first pattern 34 (see FIG. 2).

FIG. 4 illustrates an exemplary configuration 50 of the photoresist 30 with the first and second patterns 34 and 42 (see FIG. 3) formed on the photoresist. The wafer 32 with the defined first and second patterns 34 and 42 on the photoresist 30 is developed through a negative tone resist process to remove unexposed portions of the photoresist. In one exemplary embodiment, the first and second patterns 34 and 42 are defined using a negative tone photoresist 30 (see FIG. 2) and the wafer 32 is developed to remove the unexposed portions of the photoresist 30.

In an alternate embodiment, the first and second patterns 34 and 42 are defined using a positive tone photoresist 30 and the wafer 32 is developed using a negative tone process to remove the unexposed portions of the photoresist 30. In the illustrated embodiment, the unexposed portions of the first pattern 34 form trenches 52 in the photoresist 50. Further, the unexposed portions of the second pattern 42 form resist bridges, such as represented by reference numeral 54. In certain embodiments, the resist bridges 54 formed by the process described above have relatively lesser critical dimensions (CDs) as compared to resist bridges formed using a single exposure. Thus, a plurality of patterns with different orientations and varied pitches may be formed by using the negative tone resist process described above. In certain embodiments, illumination sources for the exposures may be independently configured to achieve a desired resolution of the images of the first and second patterns In one exemplary embodiment, the negative tone resist process to remove unexposed portions of photoresist 30 is employed to form a plurality of isolated features on the photoresist 30. Exemplary process for forming the isolated features is defined below with reference to FIGS. 5-10.

Figure 7:
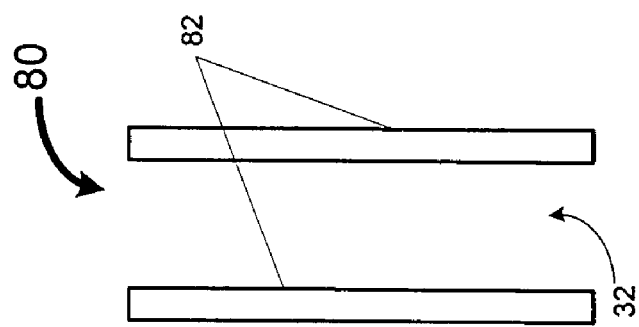
FIG. 7 illustrates exemplary isolated features formed by developing the wafer with the first and second patterns in accordance with embodiments of present technique.
Figure 6:
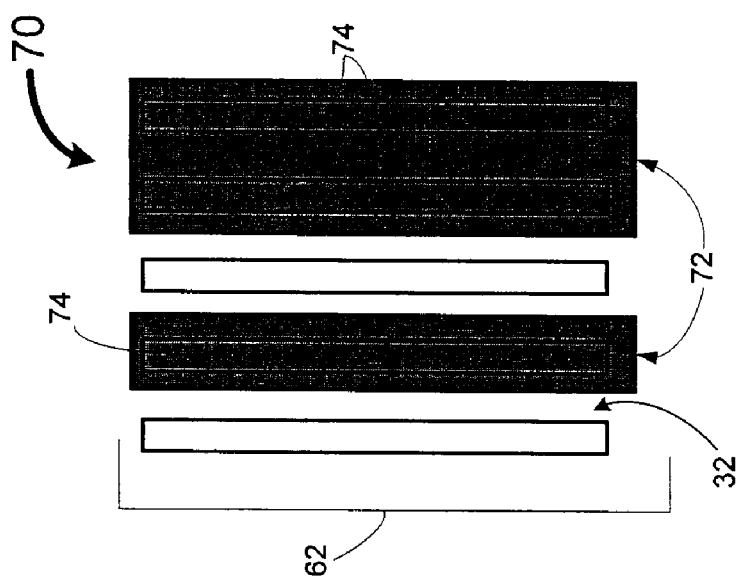
FIG. 6 illustrates an exemplary configuration of photoresist on the wafer with second pattern defined on the photoresist in accordance with embodiments of present technique.
Figure 5:
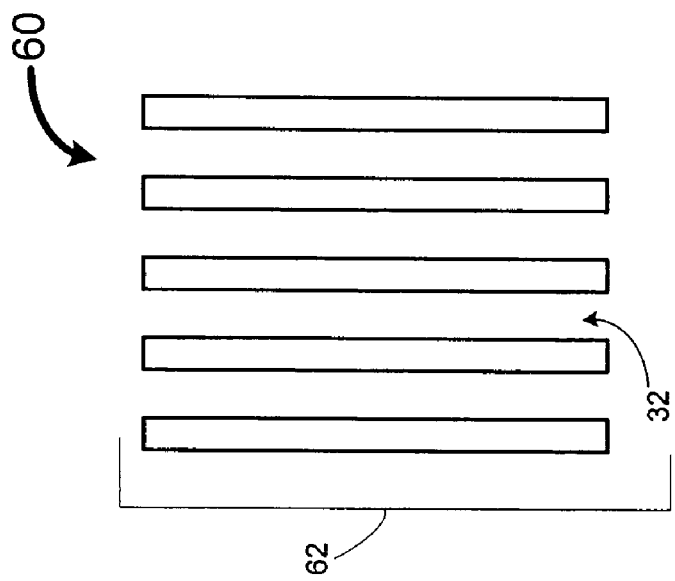
FIG. 5 illustrates an exemplary configuration of photoresist on the wafer with a first pattern defined on the photoresist in accordance with embodiments of present technique.

FIG. 5 illustrates an exemplary configuration 60 of photoresist on the wafer 32 with a first pattern 62 defined on the photoresist 60. In this exemplary embodiment, the first pattern 62 is defined by projecting an image of the first pattern 62 using a first reticle (not shown). In one exemplary embodiment, the first pattern 62 includes a uniform grating pattern with a pre-defined grating pitch. FIG. 6 illustrates an exemplary configuration 70 of photoresist on the wafer 32 with second pattern 72 defined on the photoresist 70. In this exemplary embodiment, the second pattern 72 is defined by selectively plugging unexposed portions 74 of the first pattern 62. FIG. 7 illustrates exemplary isolated features 80 formed by developing the wafer 32 with the first and second patterns 62 and 72.

As illustrated, the wafer 32 is developed using the negative tone process to remove the unexposed portions 74 to form the isolated features such as represented by reference numerals 82 and 84. In this exemplary embodiment, two features 82 and 84 are formed by removing the unexposed portions 74 of the photoresist. However, a greater or a lesser number of isolated features may be formed on the photoresist.

Figure 9:
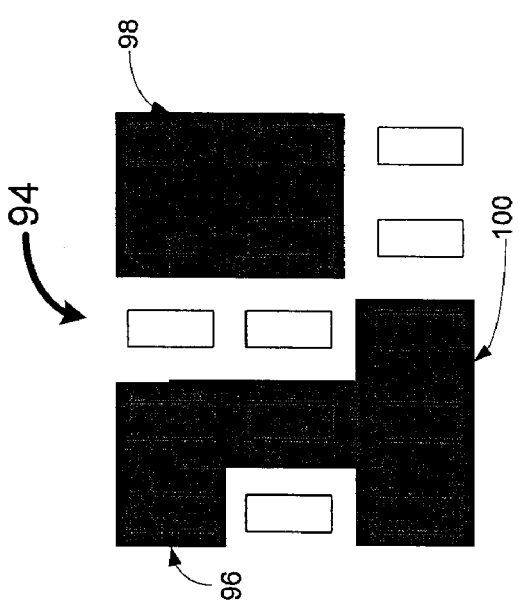
FIG. 9 illustrates an exemplary second pattern formed on the photoresist on the wafer in accordance with embodiments of present technique.
Figure 8:
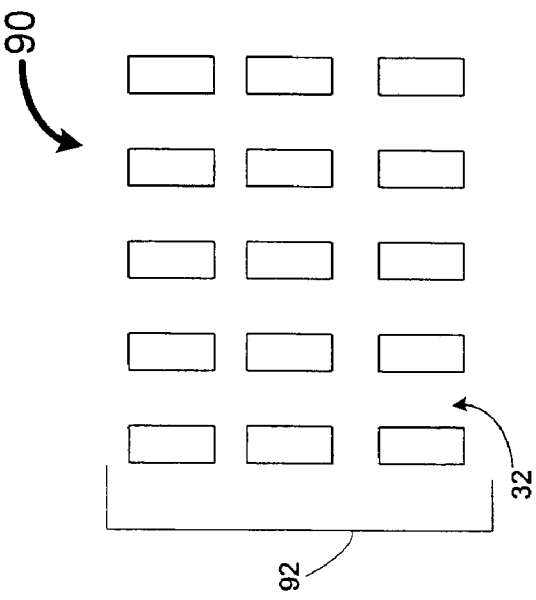
FIG. 8 illustrates another exemplary configuration of photoresist on the wafer with a first pattern defined on the photoresist in accordance with embodiments of present technique.

FIG. 8 illustrates another exemplary configuration 90 of photoresist on the wafer 32 with a first pattern 92 defined on the photoresist 90. In this embodiment, the first pattern 92 includes a uniform grating pattern having a pre-determined grating pitch. In certain embodiments, an illumination source is configured to achieve a desired pitch of the first pattern 92 on the photoresist 90. Based upon a desired pattern of isolated features, portions of the first pattern 92 may be plugged to form a second pattern on the photoresist 90. FIG. 9 illustrates an exemplary second pattern 94 formed on the photoresist 90 (see FIG. 8). As illustrated, portions such as represented by reference numerals 96, 98 and 100 are plugged to form the second pattern 94 on the photoresist 90. Such unexposed portions are removed using the negative tone resist process.

Figure 10:
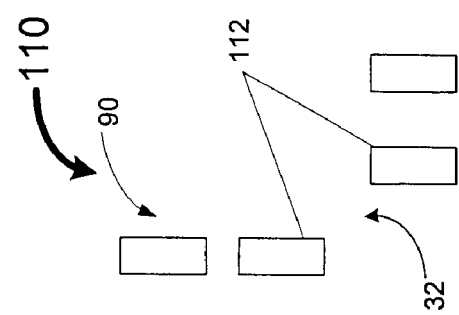
FIG. 10 illustrates an exemplary pattern of isolated features formed on the photoresist in accordance with embodiments of present technique.

FIG. 10 illustrates an exemplary pattern 110 of isolated features 112 formed on the photoresist 90. In this exemplary embodiment, the wafer 32 is developed and the unexposed portions such as represented by 96, 98, 100 (see FIG. 9) of the photoresist 90 are removed to form the isolated features 112. A variety of patterns of the isolated features 112 may be formed by selectively removing portions of the photoresist using the negative tone resist process. Further, the isolated features 112 are formed on the wafer 32 by etching portions of the wafer corresponding to areas without the photoresist 90. Thus, a plurality of isolated features 112 may be formed on the wafer 32 using the double exposure negative tone resist process without the need of subresolution assistant features (SRAFs).

As previously described, the wafer 32 may be subjected to double exposure for defining the patterns without removing from the scanner chuck thereby reducing an alignment error between layouts for defining the first and second patterns. Further, the technique described above allows for double exposures into the same photo resist film thereby achieving resolutions which may be difficult through a single exposure. The double exposure and negative tone resist process also substantially reduces cost of forming the pattern as compared to other double patterning techniques that require separate passes through a resist coat and exposure followed by an etch of the wafer to form the pattern. Thus, features such as trenches and holes may be defined using the double exposure without substantially impacting an aerial image of each feature.

Moreover, the optical proximity correction (OPC) for the process described above is simplified as the second exposure for defining the second pattern is not affected by the topography of the wafer or non-ideal reflectivity due to the topography. The negative tone resist process described above may be further used with an overexposure to achieve small trench patterning which is difficult to achieve using a positive develop process. Further, the second exposure to form the second pattern facilitates defining two-dimensional features on the photoresist. Thus, the process aids the design for manufacturing and improves overall process window and the patterning capabilities.

Figure 11:
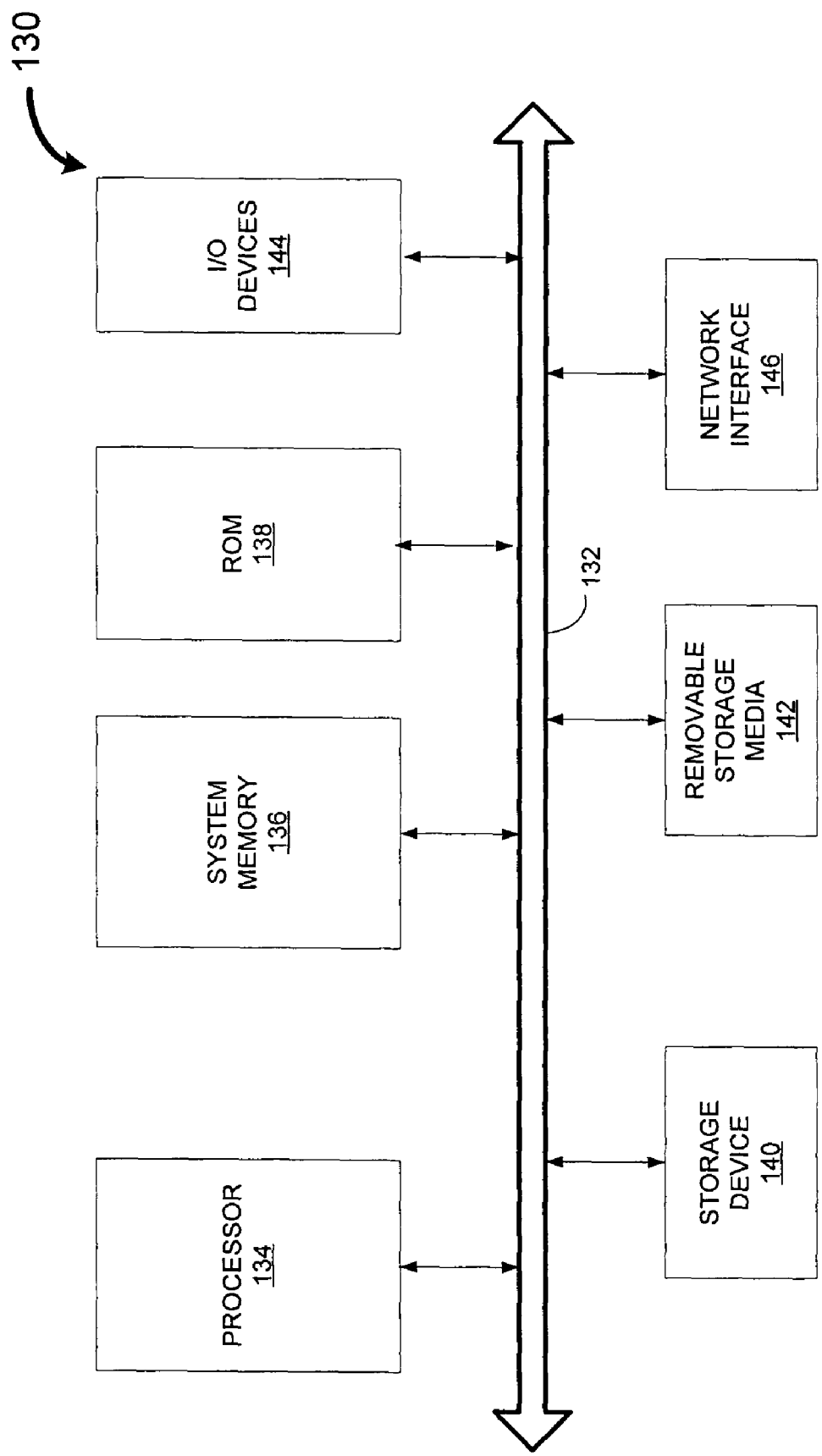
FIG. 11 illustrates an embodiment of a computer system.

The device described above may be disposed in a computer system, a wireless communicator and a hand-held device. FIG. 11 illustrates an embodiment of a computer system 130. The computer system 130 includes a bus 132 to which the various components are coupled. In certain embodiments, the bus 132 includes a collection of a plurality of buses such as a system bus, a Peripheral Component Interface (PCI) bus, a Small Computer System Interface (SCSI) bus, etc. Representation of these buses as a single bus 132 is provided for ease of illustration, and it should be understood that the system 130 is not so limited. Those of ordinary skill in the art will appreciate that the computer system 130 may have any suitable bus architecture and may include any number of combination of buses.

A processor 134 is coupled to the bus 132. The processor 134 may include any suitable processing device or system, including a microprocessor (e.g., a single core or a multi-core processor), a network processor, an application specific integrated circuit (ASIC), or a field programmable gate array (FPGA), or any similar device. It should be noted that although FIG. 8 shows a single processor 134, the computer system 1310 may include two or more processors.

The computer system 130 further includes system memory 136 coupled to the bus 132. The system memory 136 may include any suitable type and number of memories, such as static random access memory (SRAM), dynamic random access memory (DRAM), synchronous dynamic random access memory (SDRAM), or double data rate DRAM (DDRDRAM). During operation of the computer system 130, an operating system and other applications may be resident in the system memory 136.

The computer system 130 may further include a read-only memory (ROM) 138 coupled to the bus 132. The ROM 138 may store instructions for the processor 134. The computer system 130 may also include a storage device (or devices) 140 coupled to the bus 132. The storage device 140 includes any suitable non-volatile memory, such as, for example, a hard disk drive. The operating system and other programs may be stored in the storage device 140. Further, a device 142 for accessing removable storage media (e.g., a floppy disk drive or a CD ROM drive) may be coupled to the bus 132.

The computer system 130 may also include one or more Input/Output (I/O) devices 144 coupled to the bus 132. Common input devices include keyboards, pointing devices such as a mouse, as well as other data entry devices. Further, common output devices include video displays, printing devices, and audio output devices. It will be appreciated that these are but a few examples of the types of I/O devices that may be coupled to the computer system 130.

The computer system 130 may further comprise a network interface 146 coupled to the bus 132. The network interface 146 comprises any suitable hardware, software, or combination of hardware and software that is capable of coupling the system 130 with a network (e.g., a network interface card). The network interface 146 may establish a link with the network over any suitable medium (e.g., wireless, copper wire, fiber optic, or a combination thereof) supporting exchange of information via any suitable protocol such as TCP/IP (Transmission Control protocol/Internet Protocol), HTTP (Hyper-Text Transmission Protocol, as well as others.

It should be understood that the computer system 130 illustrated in FIG. 11 is intended to represent an embodiment of such a system and, further, that this system may include any additional components, which have been omitted for clarity and ease of understanding. By way of example, the system 130 may include a direct memory access (DMA) controller, a chip set associated with the processor 134, additional memory (e.g., cache memory) as well as additional signal lines and buses. Also, it should be understood that the computer system 130 may not include all the components shown in FIG. 11. The computer system 130 may comprise any type of computing device, such as a desktop computer, a laptop computer, a server, a hand-held computing device, a wireless communication device, an entertainment system etc.

In this embodiment, the computer system 130 may include the device as described in the embodiments above. By way of example, the computer system 130 may include at least one integrated circuit. The integrated circuit may include a wafer having a plurality of features. The plurality of features may be formed by exposing a photoresist to define first and second patterns on the photoresist and removing unexposed portions of the photoresist defined by the first and second patterns.

The foregoing detailed description and accompanying drawings are only illustrative and not restrictive. They have been provided primarily for a clear and comprehensive understanding of the disclosed embodiments and no unnecessary limitations are to be understood therefrom. Numerous additions, deletions, and modifications to the embodiments described herein, as well as alternative arrangements, may be devised by those skilled in the art without departing from the spirit of the disclosed embodiments and the scope of the appended claims.

The invention claimed is:

1. A method of forming a pattern on a wafer, comprising:
applying a photoresist on the wafer;
exposing the wafer to define a first pattern on the photoresist;
exposing the wafer to define a second pattern on the photoresist, wherein each of the first and second patterns comprises unexposed portions of the photoresist and wherein exposing the wafer to define first and second patterns is done without removing the wafer from a scanner chuck;
developing the wafer to form the first and second patterns on the photoresist, wherein the first and second patterns are formed by removing the unexposed portions of the photoresist.

2. The method of claim 1, further comprising etching portions of the wafer corresponding to areas without the photoresist to form the first and second patterns on the wafer.

3. The method of claim 1, wherein unexposed portions of the photoresist are removed through a negative tone resist process.

4. The method of claim 3, comprising defining the first and second patterns using a negative tone photoresist and developing the wafer to remove the unexposed portions of the negative tone photoresist.

5. The method of claim 3, comprising defining the first and second patterns using a positive tone photoresist to the wafer and developing the wafer by a negative tone develop process to remove the unexposed portions of the positive tone photoresist.

6. The method of claim 1, further comprising selectively exposing portions of unexposed photoresist of the first pattern to define the second pattern on the photoresist.

7. The method of claim 6, comprising:
forming a plurality of trenches in photoresist by removing unexposed portions of the photoresist defined by the first pattern; and
forming a plurality of resist bridges in the trenches by removing unexposed portions of the photoresist defined by the second pattern.

8. The method of claim 1, further comprising forming a plurality of isolated features on the photoresist.

9. The method of claim 8, further comprising forming the isolated features on the wafer by etching portions of the wafer corresponding to areas without the photoresist.

10. The method of claim 1, further comprising reducing an alignment error between layouts to define the first and second patterns.

11. The method of claim 1, further comprising forming images of the first and second patterns on the photoresist using first and second reticles.

12. The method of claim 11, further comprising configuring illumination sources to achieve a desired image resolution of the images of the first and second patterns.

13. A method of forming a pattern on a wafer, comprising:
applying a photoresist on the wafer;
placing the wafer on a scanner chuck;
exposing the wafer to define a first pattern on the photoresist;
exposing the wafer to define a second pattern on the photoresist, wherein each of the first and second patterns comprises unexposed portions of the photoresist and wherein exposing the wafer to define first and second patterns is done without removing the wafer from the scanner chuck;
removing the wafer from the scanner chuck; and
developing the wafer to form the first and second patterns on the photoresist, wherein the first and second patterns are formed by removing the unexposed portions of the photoresist.

14. The method of claim 13, wherein unexposed portions of the photoresist are removed through a negative tone resist process.

15. The method of claim 13, further comprising:
forming a first set of features defined by the first pattern on the photo resist; and
removing portions of the first set of features to form a second set of features on the photoresist.

16. The method of claim 15, wherein the first set of features comprises a plurality of trenches on the photoresist and the second set of features comprises a plurality of resist bridges.

17. The method of claim 13, further comprising:
selectively plugging unexposed portions of the first pattern with the photoresist to define the second pattern;
removing the unexposed portions of the photoresist defined by the second pattern to form a plurality of isolated features in the photoresist.

18. The method of claim 13, further comprising etching portions of the wafer corresponding to areas without the photoresist to form the first and second patterns on the wafer.

19. A method of forming isolated features on a wafer, comprising:
applying a photoresist on the wafer;
exposing the photoresist to define a first pattern on the photoresist;
selectively plugging unexposed portions of the first pattern with the photoresist to define a second pattern wherein the first and second patterns on the photoresist are defined without removing the wafer from a scanner chuck;
developing the wafer to remove unexposed portions of the photoresist defined by the first and second patterns.

20. The method of claim 19, further comprising forming the isolated features on the wafer by etching portions of the wafer corresponding to areas without the photoresist.

21. The method of claim 19, wherein the unexposed portions of the photoresist are removed through a negative tone resist process.

22. The method of claim 19, further comprising configuring illumination sources to achieve a desired pitch of the first and second patterns defined on the photoresist.

* * * * *